United States Patent
Satoh

(10) Patent No.: US 7,501,846 B2
(45) Date of Patent: Mar. 10, 2009

(54) MEASUREMENT APPARATUS AND MEASUREMENT METHOD

(75) Inventor: Tadaaki Satoh, Tokyo (JP)

(73) Assignee: Advantest Corporation, Tokyo (JP)

( * ) Notice: Subject to any disclaimer, the term of this patent is extended or adjusted under 35 U.S.C. 154(b) by 29 days.

(21) Appl. No.: 11/595,791

(22) Filed: Nov. 9, 2006

(65) Prior Publication Data

US 2008/0111538 A1    May 15, 2008

(51) Int. Cl.
  *G01R 31/26* (2006.01)
(52) U.S. Cl. .................. 324/765; 324/158.1
(58) Field of Classification Search .............. 324/763, 324/765, 158.1, 17 R; 438/14–17; 714/724, 714/733–734
See application file for complete search history.

(56) References Cited

U.S. PATENT DOCUMENTS

| | | | | |
|---|---|---|---|---|
| 5,455,733 | A * | 10/1995 | Waggamon | 361/115 |
| 5,917,331 | A * | 6/1999 | Persons | 324/765 |
| 6,259,267 | B1 * | 7/2001 | Fujiwara | 324/765 |
| 6,445,208 | B1 * | 9/2002 | Sugamori | 324/771 |
| 6,946,829 | B2 * | 9/2005 | Sardat | 324/117 R |
| 2004/0085059 | A1 * | 5/2004 | Smith | 324/158.1 |

OTHER PUBLICATIONS

Yushihiro Hashimoto and Kenji Izawa, "Increase Speed Twentyfold Advantest LSI Tester", Nikkei Electronics, published by Nikkei Business Publications, Inc. on Jul. 7, 1997, pp. 85-97.
Nobuhiro Sato and Yoshihiro Hashimoto, "A High Precision IDDQ Measurement System with Improve Dynamic Load Regulation" USA, ITC2003, 2003, P410 Paper 15,2, 6 pages.
Rachit Rajsman, "IDDQ Testing for CMOS VLSI", USA, Artech House Inc., 1995, P141, Chapter 5, 8 pages.

* cited by examiner

*Primary Examiner*—Ha Tran T Nguyen
*Assistant Examiner*—Arleen M Vazquez
(74) *Attorney, Agent, or Firm*—Osha • Liang LLP

(57) ABSTRACT

A measurement apparatus that measures a current consumed by an electronic device is provided. The measurement apparatus includes: a power supply output terminal connected to the electronic device; a power supply voltage output section that output a power supply voltage; a diode switch section having two diodes connected in parallel between the power supply output terminal and the power supply voltage output section so as to rectify in the direction opposed to each other that applies the current consumed by the electronic device between the power supply output terminal and the power supply voltage output section when the electronic device is in operation; a rest time drive section that applies the current consumed by the electronic device to the power supply output terminal so as to keep the voltage of the power supply output terminal the same as the power supply voltage when the electronic device is in resting state; and a rest time current measurement section that measures the output current value of the rest time drive section.

12 Claims, 3 Drawing Sheets

MEASUREMENT APPARATUS AND MEASUREMENT METHOD

BACKGROUND

1. Field of the Invention

Figure 1:
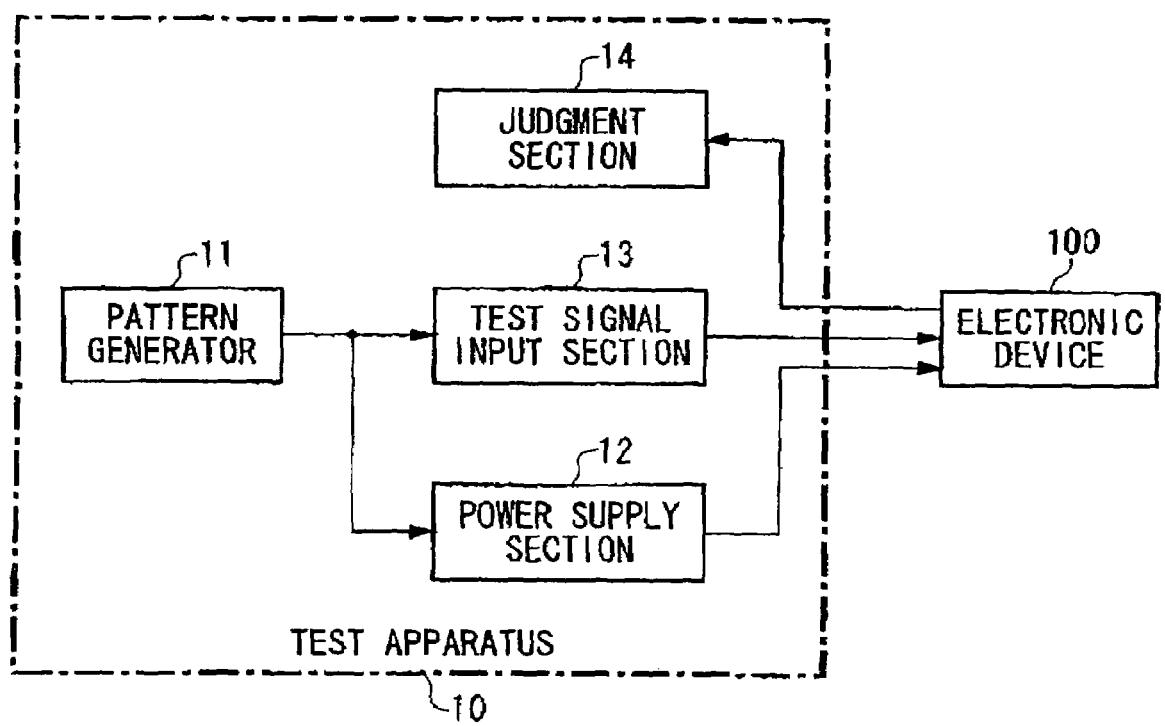

The present invention relates to a measurement apparatus and a measurement method. Particularly, the present invention relates to a measurement apparatus and a measurement method that measure a current consumed by an electronic device.

2. Related Art

A test apparatus has a function to measure a consumption current when a device under test is in resting state, for example, as disclosed in a non-patent document 1: Yushihiro Hashimoto and Kenji Izawa "Increase speed twentyfold Advantest LSI tester, Nikkei Electronics published by Nikkei Business Publications, Inc on Jul. 7, 1997, P85; a non-patent document2: Nobuhiro Sato, Yoshihiro Hashimoto, "A High Precision Iddg Measurement System with Improve Dynamic Load Regulation", USA, ITC2003, 2003, P 410 Paper 15, 2; a non-patent document 3 : Rachit Rajsman, "Iddg Testing For CMOS VLSI", USA, Artech House INC., 1995, P141 Chapter 5. The test apparatus uses an amplifier being capable of outputting a large current as an amplifier for the power supply of the device under test. However, if such amplifier being capable of outputting a large current, the consumption current by the device under test in resting state can not be accurately measured. Therefore, the test apparatus has accurately measured the current in resting state by separately providing an amplifier of which current supply performance is not good but which can accurately measure the current and changing it to another amplifier for testing a current in resting state when the current is measured in resting state.

Meanwhile, the test apparatus includes a switch for a large current that can apply a large current when the device under test is in operation in order to switch the amplifier that provides a power supply voltage between an operating state and a resting state of the device under test. However, the operating speed of the switch for a large current is slow. Therefore, it takes a long time to stabilize a current supply when the device under test is switched between the operating state and the resting state, so that the start of a measurement has gotten late.

Thus, the advantage of the present invention is to provide a measurement apparatus and a measurement method which are capable of solving the problem accompanying the conventional art. The above and other advantages can be achieved by combining the features recited in independent claims. Then, dependent claims define further effective specific example of the present invention.

SUMMARY

In order to solve the above described problems, a first aspect of the present invention provides a measurement apparatus that measures a current consumed by an electronic device. The measurement apparatus includes: a power supply output terminal connected to the electronic device; a power supply voltage output section that outputs a power supply voltage; a diode switch section having two diodes connected in parallel between the power supply output terminal and the power supply voltage output section so as to rectify in the direction opposed to each other that applies between the power supply output terminal and the power supply voltage output section a current consumed by the electronic device when the electronic device is in Operation; a rest time drive section that provides the current consumed by the electronic device to the power supply output terminal so as to keep the voltage of the power supply output terminal the same as the power supply voltage when the electronic device is in resting state; and a rest time current measurement section that measures an output current value of the rest time drive section.

The rest time drive section may respond to the change of output current more speedily than the power supply voltage output section.

The rest time drive section may include a voltage follower circuit including an operational amplifier to which the power supply voltage outputted from the power supply voltage output section is inputted, and a switch disposed between an output end of the voltage follower circuit and the power supply output terminal that closes when the electronic device is in resting state and opens when the electronic device is in operation.

The power supply voltage output section may include an amplifier circuit that amplifies an input voltage by the negative feedback according to a feedback voltage to output a power source voltage obtained by amplifying the input voltage by a predetermined gain, and a feedback circuit that provides the feedback voltage to the amplifier circuit. The feedback circuit may provide the output voltage of the amplifier circuit to the amplifier circuit as the feedback voltage when the electronic device is in resting state and provide the voltage of the power supply output terminal to the amplifier circuit as the feedback voltage when the electronic device is in operation.

The measurement apparatus may further include an operating time current measurement section that measures an output current value of the power voltage output section when the electronic device is in operation.

The measurement apparatus may further include an operating time current measurement section that measures an output current value of the power supply voltage output section when the electronic device is in operation.

The measurement apparatus may further include a test signal input section that inputs a test signal to the electronic device, and a judgment section that judges the electronic device based on an output signal of the electronic device according to the test signal.

A second aspect of the present invention provides a measurement method of measuring a current consumed by an electronic device. The measurement method includes: providing a power supply voltage to the electronic device by a power supply device having a power supply output terminal connected to the electronic device, a power supply voltage output section that outputs a power supply voltage, a diode switch section having two diodes connected in parallel between the power supply output terminal and the power supply voltage output section so as to rectify in the direction opposed to each other and a rest time drive section that keeps the voltage of the power supply output terminal the same as the power supply voltage; applying between the power supply output terminal and the power supply voltage output section a current consumed by the electronic device through the diode switch section when the electronic device is in operation; and providing the current consumed by the electronic device from the rest time drive section to the power supply output terminal and measuring an output current value of the rest time drive section when the electronic device is in resting state.

Here, all necessary features of the present invention are not listed in the summary of the invention. The sub-combinations of the features may become the invention.

BRIEF DESCRIPTION OP THE DRAWINGS

Figure 2:
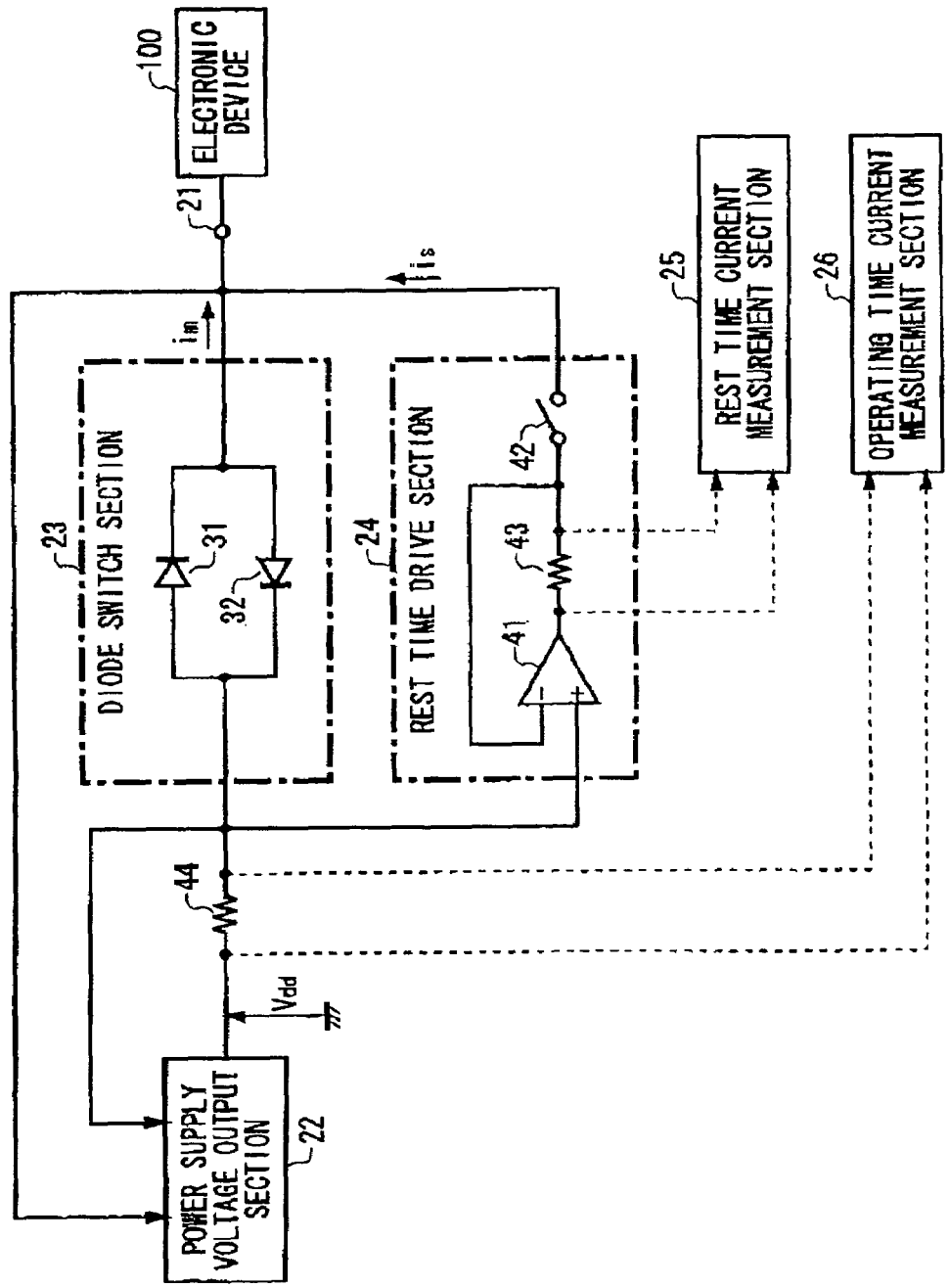
Figure 3:
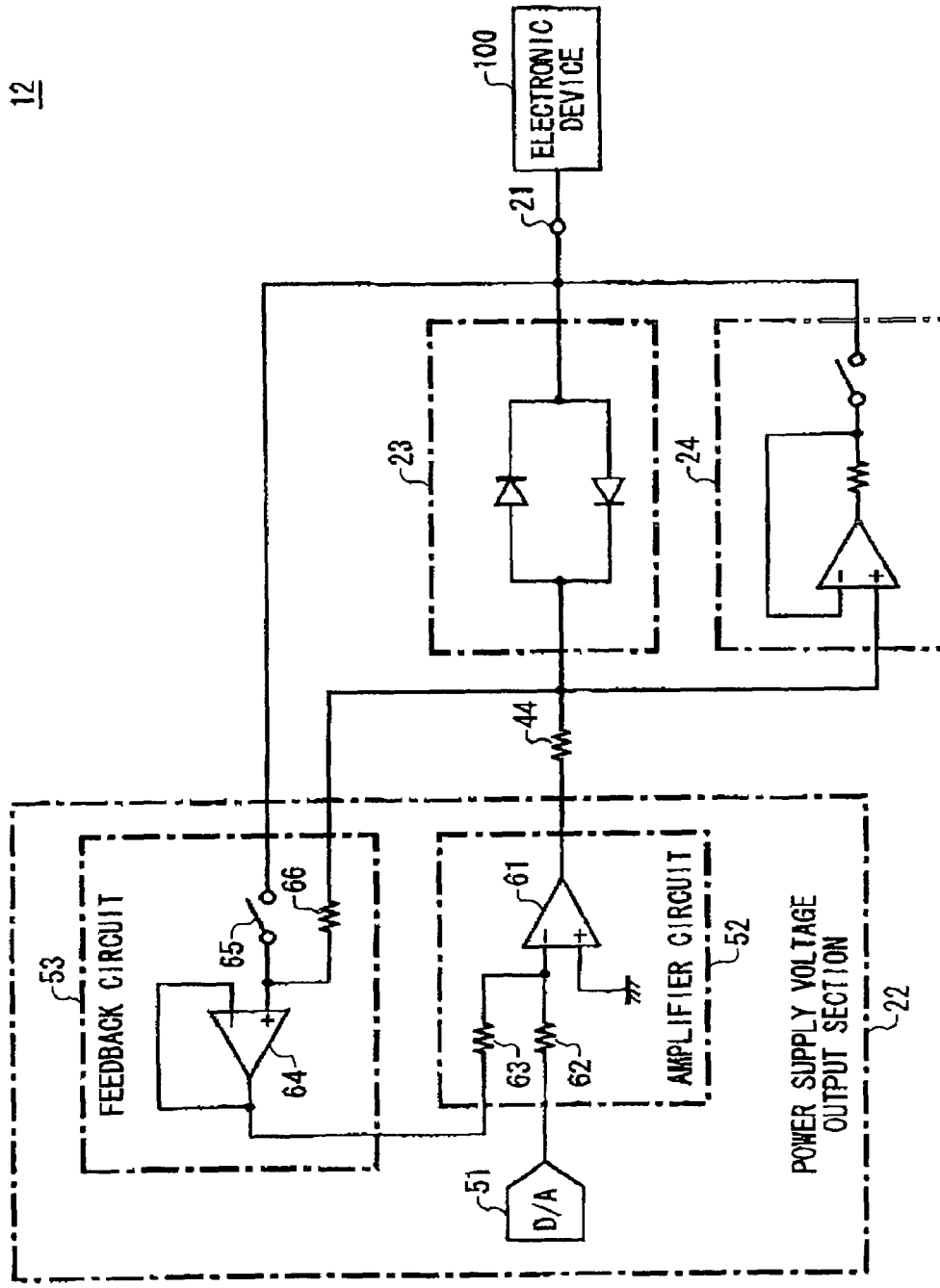

FIG. 1 shows a configuration of a test apparatus 10, and an electronic device 100;

FIG. 2 shows a configuration of a power supply section 12, and the electronic device 100; and FIG. 3 shows an example of circuit configuration as a power supply voltage output section 22.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

FIG. 1 shows a configuration of a test apparatus 10, and an electronic device 10. The test apparatus 10 tests the electronic device 100 such as a semiconductor device. Additionally, the test apparatus 10 is an example of measurement apparatus according to the present invention, which is capable of switching between a current measurement in operation and a current measurement in resting state at high speed.

The test apparatus 10 includes a pattern generator 11, a power supply section 12, a test signal input section 13 and a judgment section 14. The pattern generator 11 generates a test pattern indicative of a pattern of a test signal waveform provided to the electronic device 100. The power supply section 12 provides a power supply voltage to the electronic device 100. The test signal input section 13 generates a test signal by shaping the waveform according to the test pattern and inputs the generated test signal to the electronic device 100. The judgment section 14 judges pass/fail of the electronic device 100 based on the output signal outputted by the electronic device according to the provided test signal.

FIG. 2 shows the configuration of the power supply section 12, and the electronic device 100. The power supply section 12 provides a power supply voltage to the electronic device 100 and measures a current consumed by the electronic device 100 at high speed when the electronic device is in resting state. Here, a resting state of the electronic device 100 means a state that the current consumed by the electronic device 100 is significantly reduced because of stopping the operation in various internal circuits due to stopping providing clocks. For example, the resting state may include a sleep state and a power-saving mode. The operating state of the electronic device 100 is not a state in which the electronic device is in resting state but a state in which clocks are provided and the electronic device 100 is normally operating, for example.

The power supply section 12 includes a power supply output terminal 21, a power supply voltage output section 22, a diode switch section 23, a rest time drive section 24, a rest time current measurement section 25 and an operating time current measurement section 26.

The power supply output terminal 21 is connected to the electronic device 100 and provides the voltage outputted from the power supply section 12 to a power supply terminal of the electronic device 100. The power supply voltage output section 22 outputs a power supply voltage Vdd stabilized to a predetermined value by such as a negative feedback control. The diode switch, section 23 includes a forward direction diode 31 and a backward direction diode 32 connected in parallel between the power supply voltage output section 22 and the output end of the power supply voltage terminal 21 so as to rectify in the direction opposed to each other. The diode switch section 23 function s as a diode switch which is turned on when a potential difference between the power supply voltage output section 22 and the power supply output terminal 21 is more than the threshold voltage, e.g. 0.6V, and which is turned off when the potential difference between the power supply voltage output section 22 and the power supply output terminal 21 is less than the threshold voltage.

The rest time drive section 24 provides a current consumed by the electronic device 100 to the power supply output terminal 21 such that the voltage of the power supply output terminal 21 is kept to the voltage same as the power supply voltage Vdd when the electronic device is in resting state. Since the rest time drive section 24 is separated from the power supply output terminal 21 when the electronic device 100 is in operation, it does not affect the voltage of the power supply output terminal 21 and the current provided to the power supply output terminal 21.

The rest time drive section 24 switches between the operating state and the resting state according to the timing indicated by the test pattern, for example.

Additionally, the rest time driving section 24 has a circuit configuration being capable of responding to the change of the output current more speedily than the power supply voltage output section 22. Thereby the rest time drive section 24 can speedily respond in resting time and accurately measure a consumption current in resting time.

For example, the rest time drive section 24 includes a first voltage follower circuit 41 to which the power supply voltage Vdd is inputted and a first switch 42 disposed between the output end of the first voltage follower 41 and the power supply output terminal 21. The first voltage follower circuit 41 is a voltage follower circuit including an operational amplifier. The voltage follower circuit directly feeds back the output voltage to an inverting input terminal of the operational amplifier to stabilize the voltage the same as the voltage inputted to a noninverting input terminal and output the same regardless of any load change. In the first voltage follower circuit 41, the power supply voltage Vdd is inputted to the noninverting input terminal, so that the voltage the same as the power supply voltage Vdd is outputted from the output end regardless of any load change of the electronic device 100. The first switch 42 is controlled such that the first switch 42 is closed when the electronic device 100 is in resting state and the first switch 42 is opened when the electronic device 100 is in operation. As described above, the rest time drive section 24 can switch between an operating state and a resting state by controlling the first switch 42 to open and close.

Here, with respect to the first switch 42, a consumption current is applied in the resting state but any current is not applied in the operating state. That is, the first switch 42 can respond at high speed because a large current is not applied thereto. Thereby the rest time drive section 24 can speedily switch between an operating state and a resting state and rapidly start to measure a power supply current in a resting state.

The rest time current measurement section 25 measures an output current value outputted from the rest time drive section 24 when the electronic device is in resting state. For example, the rest time current measurement section 25 detects the voltage between the terminals of a first current detecting low-resistor 43 provided at the output end of the operational amplifier including the first voltage follower circuit 41 to measure the output current value. The rest time current measurement section 25 can measure a consumption current when the electronic device 100 is in resting state by measuring the output current value.

The operating time current measurement section 26 measures the output current value outputted from the power supply voltage output section 22 when the electronic device 100 is in resting state. For example, the operating time current measurement section 26 detects the voltage between the terminals of a second current detecting low-resistor 44 provided at the output end of the power supply voltage output section 22 to measure the output current value. The operating time current measurement section 26 can measure the consumption current when the electronic device is in operation by measuring the output current value.

As described above, the power supply section 12 provides the current outputted from the power supply voltage output section 22 to the power supply output terminal 21 through the diode switch section 23 when the electronic device 100 is in operation. That is, when the electronic device 100 is in operation, the diode switch is turned on without applying any voltage from the rest time drive section 24 to the power supply output terminal 21, so that a current consumed by the electronic device 100 is applied between the power supply voltage output section 22 and the power supply output terminal 21 through the diode switch 23.

Meanwhile, the power supply section 12 provides the current outputted from the rest time drive section 24 to the power supply output terminal 21 when the electronic device 100 is in resting state. That is, when the electronic device 100 is in resting state, the rest time drive section 24 applies the power supply voltage Vdd to the power supply output terminal 21 and the voltages of the input and the output of the diode switch 23 are equal to each other, so that the diode switch section 23 is turned off. Therefore, a current consumed by the electronic device 100 is not applied to the diode switch section 23.

Thus, the power supply section 12 stops providing any current from the power supply voltage output section 22 when the electronic device is in resting state by means of the diode switch section 23 disposed between the power supply voltage output section 22 and the power supply output terminal 21. Thereby the power supply section 12 can switch without any switch means for applying a large current, so that the speed is increased. Therefore, a measurement of a power supply current can be rapidly started when the electronic device is in resting state.

FIG. 3 shows an example of circuit configuration as the power supply voltage output section 22. The power supply voltage output section 22 may include a digital/analog converter 5i, an amplifier circuit 52 and a feedback circuit 53, for example.

A preset digital value is inputted to the digital/analog converter 51, and then, the digital/analog converter 51 generates an analog voltage indicated by a digital value (hereinafter referred to as an input voltage).

The amplifier circuit 52 amplifies by the negative feedback the input voltage outputted from the digital/analog converter 51 according to the voltage which is fed back through the feedback circuit 53 (hereinafter referred to as a feedback voltage) to output the power supply voltage Vdd obtained by amplifying the input voltage by a predetermined gain. For example, the amplifier circuit 52 may include an inverting amplifier circuit having an operational amplifier 61, an input resistor 62 and a feedback resistor 63. With respect to the inverting amplifier circuit, the predetermine gain is determined based on the ratio between the input resistor 62 and the feedback resistor 63.

The feedback circuit 53 provides the feedback voltage to the amplifier circuit 52. The feedback circuit 53 provides the feedback voltage to the feedback resistor 63 in the inverting amplifier circuit, for example. The feedback circuit 53 switches the feedback voltage between the operating state and the resting state of the electronic device 100. Specifically, since the feedback circuit 53 stabilizes the voltage provided to the electronic device 100 when the electronic device is in operation, the voltage of the power supply output terminal 21 is provided to the amplifier circuit 52 as the feedback voltage. In the feedback circuit 53, the voltage is dropped little by rest time drive section 24 when the electronic device is in resting time, so that the power supply voltage Vdd being the output voltage of the amplifier circuit 52 is provided to the amplifier circuit 52 as the feedback voltage.

For example, the feedback circuit 53 includes a second voltage follower circuit 64, a second switch 65 and a feedback voltage resistor 66.

The second voltage follower 64 is a voltage follower circuit including an operational amplifier. The voltage of the power supply output terminal 21 is inputted to a noninverting input terminal of the second voltage follower circuit 62 through the feedback voltage resistor 66, and the power supply voltage Vdd is also inputted to the noninverting input terminal of the second voltage follower circuit 62 through the second switch 65. The feedback voltage resistor 66 has a resistance value which does not affect the power supply voltage Vdd and the measurement current. The second switch 65 is controlled such that it is closed when the electronic device is in operation and it is opened when the electronic device is in resting state. Thereby the feedback circuit 53 can perform a switching such that the voltage of the power supply output terminal 21 is the feedback voltage when the electronic device is in operation and the power supply voltage Vdd is the feedback voltage when the electronic device is in resting state. Additionally, the second switch 65 can respond at high speed because the feedback voltage is applied thereto but a large current is not applied thereto. Accordingly, the feedback circuit 53 can switch at high speed and rapidly start to measure the power supply current when the electronic device is in resting state.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

As described above, the embodiment of the present invention can provide the measurement apparatus and the measurement method being capable of switching between a current measurement in operation and a current measurement in resting state.

What is claimed is:

1. A measurement apparatus that measures a current consumed by an electronic device, comprising: a power supply output terminal connected to the electronic device; a power supply voltage output section that outputs a power supply voltage; a diode switch section having two diodes connected in parallel between the power supply output terminal and the power supply voltage output section so as to rectify in the direction opposed to each other that applies between the power supply output terminal and the power supply voltage output section a current consumed by the electronic device when the electronic device is in operation; a rest time drive section that provides the current consumed by the electronic device to the power supply output terminal so as to keep a voltage of the power supply output terminal the same as the power supply voltage when the electronic device is in resting state, said rest time drive section comprising a voltage follower circuit comprising an operational amplifier to which the power supply voltage output from the power supply voltage output section is input; and a switch disposed between an output end of the voltage follower circuit and the power supply output terminal that closes when the electronic device is in resting state, and opens when the electronic device is in operation; and a rest time current measurement section that measures an output current value of the rest time drive section.

2. The measurement apparatus as set forth in claim 1, wherein the rest time drive section responds to a change of the output current more speedily than the power supply voltage output section.

3. The measurement apparatus as set forth in claim 1, wherein the power supply voltage output section comprises:
   an amplifier circuit that outputs the power supply voltage obtained by amplifying an input voltage by a predetermined gain; and
   a feedback circuit that provides a feedback voltage to the amplifier circuit,
   wherein the feedback circuit provides the output voltage of the amplifier circuit to the amplifier circuit as the feedback voltage when the electronic device is in resting state, and provides the voltage of the power supply output terminal to the amplifier circuit as the feedback voltage when the electronic device is in operation.

4. The measurement apparatus as set forth in claim 1 further comprising an operating time current measurement section that measures the output current value of the power supply voltage output section when the electronic device is in operation.

5. The measurement apparatus as set forth in claim 1 further comprising:
   a test signal input section that inputs a test signal to the electronic device; and
   a judgment section that judges the electronic device based on an output signal of the electronic device according to the test signal.

6. A measurement method of measuring a current consumed by an electronic device comprising:
   providing a power supply voltage to the electronic device by a power supply device having a power supply output terminal connected to the electronic device, a power supply voltage output section that outputs a power supply voltage, a diode switch section having two diodes connected in parallel between the power supply output terminal and the power supply voltage output section so as to rectify in the direction opposed to each other and a rest time drive section that keeps a voltage of the power supply output terminal the same as the power supply voltage;
   providing through an amplifier circuit the power supply voltage obtained by amplifying an input voltage by a predetermined gain;
   providing the output voltage of the amplifier circuit to the amplifier circuit as a feedback voltage when the electronic device is in resting state;
   providing the voltage of the power supply output terminal to the amplifier circuit as the feedback voltage when the electronic device is in operation;
   applying between the power supply output terminal and the power supply voltage output section a current consumed by the electronic device though the diode switch section when the electronic device is in operation; and
   providing the current consumed by the electronic device from the rest time drive section to the power supply output terminal and measuring an output current value of the rest time drive section when the electronic device is in resting state.

7. The measurement apparatus as set forth in claim 1, wherein the diode switch section and the rest time drive section are connected to the power supply voltage output section in parallel.

8. A measurement apparatus that measures a current consumed by an electronic device comprising:
   a power supply output terminal connected to the electronic device;
   a power supply voltage output section that outputs a power supply voltage comprising:
      an amplifier circuit that outputs the power supply voltage obtained by amplifying an input voltage by a predetermined gain; and
      a feedback circuit that provides a feedback voltage to the amplifier circuit,
      wherein the feedback circuit provides the output voltage of the amplifier circuit to the amplifier circuit as the feedback voltage when the electronic device is in resting state, and provides the voltage of the power supply output terminal to the amplifier circuit as the feedback voltage when the electronic device is in operation;
   a diode switch section having two diodes connected in parallel between the power supply output terminal and the power supply voltage output section so as to rectify in the direction opposed to each other that applies between the power supply output terminal and the power supply voltage output section a current consumed by the electronic device when the electronic device is in operation;
   a rest time drive section that provides the current consumed by the electronic device to the power supply output terminal so as to keep a voltage of the power supply output terminal the same as the power supply voltage when the electronic device is in resting state; and
   a rest time current measurement section that measures an output current value of the rest time drive section.

9. The measurement apparatus as set forth in claim 8, wherein the rest time drive section responds to a change of the output current more speedily than the power supply voltage output section.

10. The measurement apparatus as set forth in claim 8 further comprising an operating time current measurement section that measures an output current value of the power supply voltage output section when the electronic device is in operation.

11. The measurement apparatus as set forth in claim 8 further comprising:
    a test signal input section that inputs a test signal to the electronic device; and
    a judgment section that judges the electronic device based on an output signal of the electronic device according to the test signal.

12. The measurement apparatus as set forth in claim 8, wherein the diode switch section and the rest time drive section are connected to the power supply voltage output section in parallel.

* * * * *

UNITED STATES PATENT AND TRADEMARK OFFICE
CERTIFICATE OF CORRECTION

PATENT NO. : 7,501,846 B2
APPLICATION NO. : 11/595791
DATED : March 10, 2009
INVENTOR(S) : Tadaaki Satoh It is certified that error appears in the above-identified patent and that said Letters Patent is hereby corrected as shown below:

In the Claims:

In Claim 1, column 7, line 3, the word "comprising" should be followed by a colon --comprising:--.

In Claim 1, column 7, lines 3-4, the word "follower" should read --follow<u>ing</u>--.

In Claim 6, column 8, line 1, the word "though" should read --th<u>r</u>ough--.

Signed and Sealed this

Twenty-eighth Day of April, 2009

JOHN DOLL
*Acting Director of the United States Patent and Trademark Office*